United States Patent

Nikaidoh et al.

[11] Patent Number: 5,948,320
[45] Date of Patent: Sep. 7, 1999

[54] ELECTRO-CONDUCTIVE COMPOSITION AND ELECTRONIC EQUIPMENT USING SAME

[75] Inventors: Takashi Nikaidoh; Yasuichi Ono, both of Miyagi-ken; Katsuyuki Suzuki, Fukushima-ken, all of Japan

[73] Assignee: Alps Electric Co., Ltd., Tokyo, Japan

[21] Appl. No.: 09/116,181

[22] Filed: Jul. 15, 1998

[30] Foreign Application Priority Data

Jul. 17, 1997 [JP] Japan .................................... 9-192718

[51] Int. Cl.$^6$ ...................................................... H01B 1/22
[52] U.S. Cl. .......................... 252/512; 252/513; 252/514; 174/257
[58] Field of Search ...................................... 252/512, 513, 252/514, 500, 502, 503; 420/464, 477, 502, 508–510, 521; 174/257

[56] References Cited

U.S. PATENT DOCUMENTS

| | | | |
|---|---|---|---|
| 4,996,005 | 2/1991 | Saito et al. | 252/512 |
| 5,011,627 | 4/1991 | Lutz et al. | 252/512 |
| 5,678,168 | 10/1997 | Brown et al. | 428/546 |
| 5,855,820 | 1/1999 | Chan et al. | 252/511 |

*Primary Examiner*—Mark Kopec
*Assistant Examiner*—Derrick G. Hamlin
*Attorney, Agent, or Firm*—Brinks Hofer Gilson & Lione

[57] ABSTRACT

Provided are an electro-conductive composition improved on its wettability and handled with ease and an electronic equipment using the same. The electro-conductive composition comprises: 28 to 45 wt % first metallic particles easy to form an alloy with a solder; 25 to 60 wt % second metallic particles hard to diffuse into the solder; 3 to 7 wt % an oxide having a property to block penetration of the solder; and 7 to 30 wt % a resin.

7 Claims, 4 Drawing Sheets

ELECTRO-CONDUCTIVE COMPOSITION AND ELECTRONIC EQUIPMENT USING SAME

BACKGROUND OF THE INVENTION

1. Field of the Invention

The present invention relates to an electro-conductive composition used as an underlayer for a solder, for example, in soldering an electronic component on a printed circuit board or the like fabricated by printing an electro-conductive composition composed of electro-conductive particles such as metallic particles or the like and an electronic equipment using the same.

2. Description of the Related Art

In soldering an electronic component on a printed circuit board fabricated by printing an electro-conductive composition, for example, it is important that not only does a solder have a good wettability to an conductive layer of a printed circuit board with which an electronic component is connected, but a molten solder is prevented from penetrating into the conductive layer beyond a depth in soldering. Such incompatible actions are hard to be simultaneously exerted in a controllable manner in the same printed electro-conductive layer and it has in this regard been considered that direct soldering is difficult on a metal-resin composition used in an electro-conductive layer or the like on a printed circuit board. In order to make it possible to conduct soldering on an electro-conductive layer, the inventors has conceived a method in which a first composition mainly composed of metallic particles having a good wettability and a second composition mainly composed of metallic particles having a poor wettability are used as an underlayer of the solder in a superposing manner, like as the top layer composed of metallic powder which has good wettability with molten solder over the bottom layer composed of metallic powder which has poor wettability with molten solder. Since the compositions are required in use to be formed in a sequentially layered manner, there is a necessity for two compositions to be coated on an electro-conductive path on a circuit board in two applications. For example, in the case where a fine pattern is fabricated by screen process printing or the like, there have been problems that it is hard to conduct two-layer printing using the compositions without misalignment and the number of fabricating steps increase in such a process. For this reason, the inventors have developed a composition with which underlayer preparation for soldering by formation of an electro-conductive composition layer can be completed with a single application.

However, if the first composition and the second composition are simply mixed with each other, there arises no problem in wettability, but such a mixture is poor in a blocking action against penetration of amolten solder. For this reason, a solder penetrates through the mixture as a underlayer to reach a metal-resin composition printed as an circuit forming electro-conductive layer, whereby the metal-resin composition comes to solid like a metal. In such a condition, the metal resin composition loses a resin property at the interface between the composition and a board and as a result, an adhesive force of the melal-resin composition to the board becomes insufficient, so that, though it depends on circumstances, there has been a fear that the metal-resin composition, that is the electro-conductive layer, is separated from the board

SUMMARY OF THE INVENTION

It is, accordingly, objects of the present invention to provide an electro-conductive composition in which wettability is improved which is easy to be handled and an electronic equipment using the electro-conductive composition in consideration of the above technological situation.

An electro-conductive composition pertaining to the present invention comprises: 28 to 45 wt % first metallic particles easy to form an alloy with a solder; 25 to 60 wt % second metallic particles hard to diffuse into the solder; 3 to 7 wt % an oxide having a property to block penetration of the solder; and 7 to 30 wt % a resin.

In the electro-conductive composition, the first metallic particles exert actions that the particles form an alloy with a molten solder and make a solder diffuse into the electro-conductive composition.

In the electro-conductive composition, a content of the first metallic particles preferably is in the range of 28 to 45 wt %. The reason why is that, if a content of the first metallic particles is less than 28 wt %, wettability between the electro-conducive composition and a solder is decreased. To the contrary, if a content of the first metallic particles is more than 45 wt A there arises a problem that the solder penetrates into the electro-conductive composition to too much an extent.

Sizes of the metallic particles are not specifically limited but it is preferred to use the metallic particles having sizes in the range of 0.5 to 30 μm across from standpoints of handling in a fabrication process for the electro-conductive composition and screen process printing using the composition.

In the electro-conductive composition, the second metallic particles hard to diffuse into a solder exerts an action to suppress penetration of the solder into the electro-conductive composition.

In the electro-conductive composition, a content of the second metallic particles preferably is in the range of 25 to 60 wt %. The reason why is that, if a content of the second metallic particles is less than 25 wt %, the solder penetrates into the electro-conductive composition to too much an extent. To the contrary, if a content of the second metallic particles is more than 60 wt %, there arises a problem that wettability between the composition and the solder is decreased.

Sizes of the metallic particles are not specifically limited but it is preferred to use the metallic particles having sizes in the range of 0.5 to 30 μm across from standpoints of handling in a fabrication process for the electro-conductive composition and screen process printing using the composition.

In the electro-conductive composition, an oxide having a property to block penetration of the solder exerts an action that the oxide obstructs second metallic particles hard to diffuse into a solder from being instantly enclosed by a molten solder. This is because the oxide having a property to block penetration of a solder has a specific gravity of the same level as the second metallic particles and when a coating layer is formed by screen process printing or the like with use of a paste which is prepared from the electro-conductive composition and a solvent, no separation by precipitation occurs in the coating layer still in an undried condition, which entails homogeneous dispersion with ease.

In the electro-conductive composition, it is preferred that a content of the oxide is in the range of 3 to 7 wt %. The reason why is that, if a content of the oxide is less than 3 wt %, a solder penetrates into the electro-conductive composition to too much an extent. To the contrary, if a content of the oxide is more than 7 wt %, there arises a problem that weltability between the electro-conductive composition and the solder is decreased.

It is preferred that a content of a resin is in the range of 7 to 30 wt %. The reason why is that, if a content of the resin is less than 7 wt %, a proportion of a solid component in the electro-conductive composition is too much and thereby an adhesiveness between the electro-conductive composition and a solder is reduced. To the contrary, if a content of the resin is more than 30 wt %, an electro-conductivity of the electro-conductive composition is lowered and thereby the composition is not put into practical use.

The first metallic particles preferably are particles of at least one selected from the group consisting of silver, gold, lead and zinc, or particles of an alloy comprising two or more selected from the group, or more preferably are particles of silver or zinc.

The second metallic particles preferably are particles of at least one selected from the group consisting of copper, nickel, palladium and platinum, or particles of an alloy comprising two or more selected from the group, or more preferably are particles of copper, nickel or an alloy of copper and nickel (a content of nickel is in the range of 5 to 20 wt %).

As an oxide having a property to block penetration of a solder, an oxide which have a specific gravity of the same level as second metal particles hard to diffuse into the solder is preferred. For example, when copper (specific gravity of 8.92) and nickel (specific gravity of 8.845) are used as the second metal particles, bismuth trioxide ($Bi_2O_3$, specific gravity of 8.9), hafnium oxide ($HfO_2$, specific gravity of 8.68), tantalum pentoxide ($Ta_2O_5$, specific gravity of 8.735) and the like are preferably used as the oxide. Among them, bismuth trioxide and tantalum pentoxide are especially preferred.

A resin which is used as a component of the electro-conductive composition has function to facilitate contact and alloying between a molten solder and metallic particles in the electro-conducive composition. Since there is a difference in a soldering temperature between solders with different compositions in use, it is recommended that a resin is selected so that the composition corresponds to a soldering temperature. A solder which is used in the above mentioned electronic equipment is not especially limited in its kind, but it is preferred to use a solder having a melting point of 135° C. or higher, which is: a lead-tin based solder, a lead-bismuth-tin based solder, a tin-bismuth based solder, a lead-bismuth based solder, a lead-bismuth-tin-silver based solder or a tin-bismuth-silver based solder.

Generally, a soldering temperature is set at a temperature higher than a melting point of a solder in use by 15 to 35° C. For example, when one of the above mentioned solders is used, it is preferred to use at least one selected from the group consisting of ethylene-vinyl acetate resin, vinyl chloride resin, acelyl cellulose, methacrylic resin, ethyl cellulose, butadiene resin, saturated polyester, polyamide, modified polyimide, modified epoxy resin and modified phenol resin, or a modified version of the at least one. Two or more selected from the group which consists of the above mentioned resins may used as a mixture thereof.

A resin used as a component of the above mentioned electro-conductive composition may be a mixture of one of the various thermoplastic resins mentioned above with a resin which is not softened at a soldering temperature. Proportions of the mixed resins of two kinds are preferably determined according to adhesiveness with an electro-insulative substrate on which the composition is applied or printed, process conditions and the like from combinations between 50 to 90 parts by weight of a thermoplastic resin component selected from the group consisting of saturated polyester, ethylene-vinyl acetate resin, vinyl chloride resin, acetyl cellulose, methacrylic resin, ethyl cellulose, butadiene resin, polyamide andmodified versions thereof and 10 to 50 parts by weight of a thermosetting resin selected from the group consisting of phenol resin, polyimide, epoxy resin, melamine resin and modified versions thereof, so that a melting and fluidizing temperature of a resin is set at the optimal value.

As a selection method for a resin as a component of the electro-conductive composition, a method is available, in which a resin which has the same property as or a similar property to the electro-insulative substrate is selected for use. For example, when printing is conducted on a flexible film with the electro-conductive composition, it is preferred to use polyester, polyimide or the like as the resin. When printing is conducted on a rigid substrate, phenol resin, epoxy resin or the like is preferably used as a component. The reason why is that a resin which has the same property as or a similar property to the substrate is easy to become compatible with the substrate, whereby a good adhesion with the substrate can be obtained.

An electronic equipment of the present invention using the above mentioned electro-conductive composition comprises the following layers successively formed on an electro-insulative substrate in the order; an electro-conductive layer formed on the substrate; a layer made of the electro-conductive composition of the present invention formed on the electro-conductive layer; a layer made of a solder, and further comprises an electronic component whose terminal is connected to the conductive layer.

Conventionally, there has been difficulty in soldering on a printed conductive layer on an electro-insulative substrate on which no metal having a good wettability is provided, such as a plastic film, a laminated sheet, a plastic molding, a ceramic molding or the like, but with application of an electro-conductive composition of the present invention, the conductive layer and a terminal of an electronic component can be connected to each other by soldering.

DETAILED DESCRIPTION OF THE PREFERRED EMBODIMENTS

Described below will be the present invention in a detailed manner in reference to the accompanying drawings.

Figure 1:
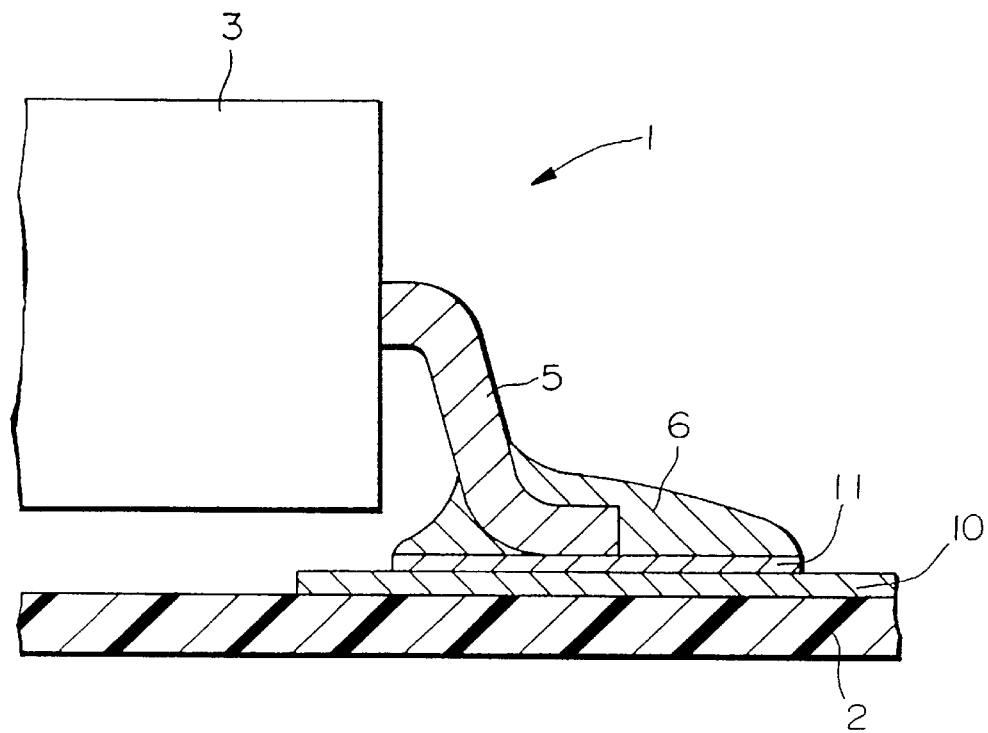
FIG. 1 is a partial sectional view showing an electronic equipment 1 pertaining to an embodiment of the present invention.

FIG. 1 is a partial sectional view showing an electronic equipment I pertaining to an embodiment of the present invention. As shown in FIG. 1, an electronic equipment 1 has construction that an electro-conductive layer 10 is formed on an electro-insulative substrate 2, for example a polyester film, an electro-conductive composition 11 layer is formed on the surface of the electro-conductive layer 10 and a terminal section 5 of an electronic component 3 is soldered with use of a solder 6.

Figure 2:
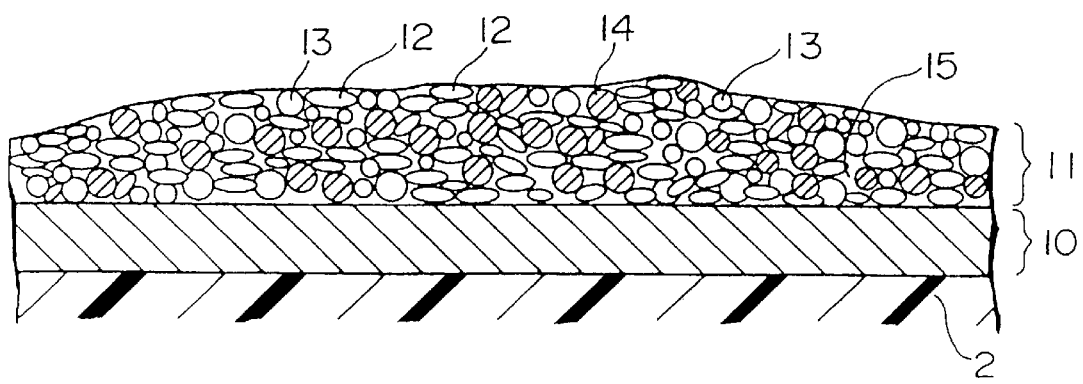
FIG. 2 is an expanded sectional view showing a structure that an electro-conductive layer 10 and an electro-conductive composition 11 layer are successively stacked on an electro-insulative substrate 2.

FIG. 2 is an expanded sectional view showing a structure that an electro-conductive layer 10 and an electro-conductive composition 11 layer are successively stacked on an electro-insulative substrate 2. In the figure, a mark 12 (shown by an ellipse) indicates a first metallic particle easy to form an alloy (having a good wettability), a mark 13 (shown by a circle) indicates a second metallic hard to diffuse into a solder (having a poor wettability) and a mark 14 (shown by a shaded circle with parallel oblique lines) indicates an oxide having a property to block penetration of a solder.

The electro-conductive composition 11 comprises: 28 to 45 wt % first metallic particles 12 easy to form an alloy with a solder, made of at least one selected from the group consisting of silver, gold, lead and zinc or made of an alloy of two or more selected from the group; 25 to 60 wt % second metallic particles 13 hard to diffuse into the solder, made of at least one selected from the group consisting of copper, nickel, palladium and platinum, or made of an alloy of two or more selected from the group; 3 to 7 wt % an oxide 14 having a property to block penetration of a solder, which is any selected from the group consisting bismuth trioxide, hafnium oxide and tantalum pentoxide; and 7 to 30 wt % a resin 15 comprising at least one selected from the group consisting of ethylene-vinyl acetate resin, vinyl chloride resin, acetyl cellulose, methacrylic resin, ethyl cellulose, butadiene resin, saturated polyester, polyamide, modifiedpolyimide, modifiedepoxy resin and modified phenol resin, a modified version of the at least one or a mixture of two or more selected from the group consisting of the above mentioned resins.

An electro-conductive composition 11 is used as a paste obtained by mixing and dispersing first metallic particles 12 easy to formanalloy with a solder and secondmetallic particles 13 hard to diffuse into the solder, an oxide 14 having a property to block penetration of a solder and a resin 15 in a solvent having good solubility with the resin 15, for example carbitol acetate in respective predetermined compositional ratios thereof. For example, 22 to 40 wt % the first metal particles 12, 20 to 53 wt % the second metallic particles 13, 2.4 to 6.2 wt % the oxide 14, 5.6 to 26 wt % the resin 15 and 12 to 20 wt % the solvent are used and the components are mixed and dispersed to obtain a paste. Such a paste is applied on a soldering place of the electro-conductive layer 10 formed on the electro-insulative substrate 2 to a thickness of 20 to 40 μm by a screen process printing method or the like and thus a land for soldering is formed.

Figure 3:
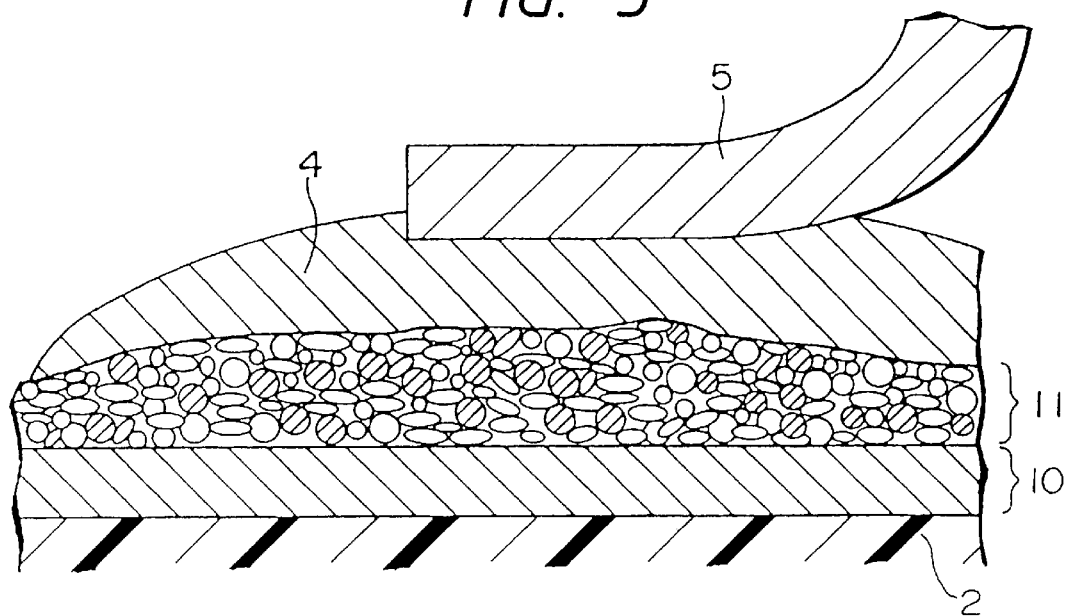
FIG. 3 is a view showing a structure that an electro-conductive composition 11 layer and a solder cream 4 layer are successively stacked on an electro-conductive composition 11 layer on an electro-insulative substrate 2 and a terminal section 5 is attached on the solder cream 4.
Figure 4:
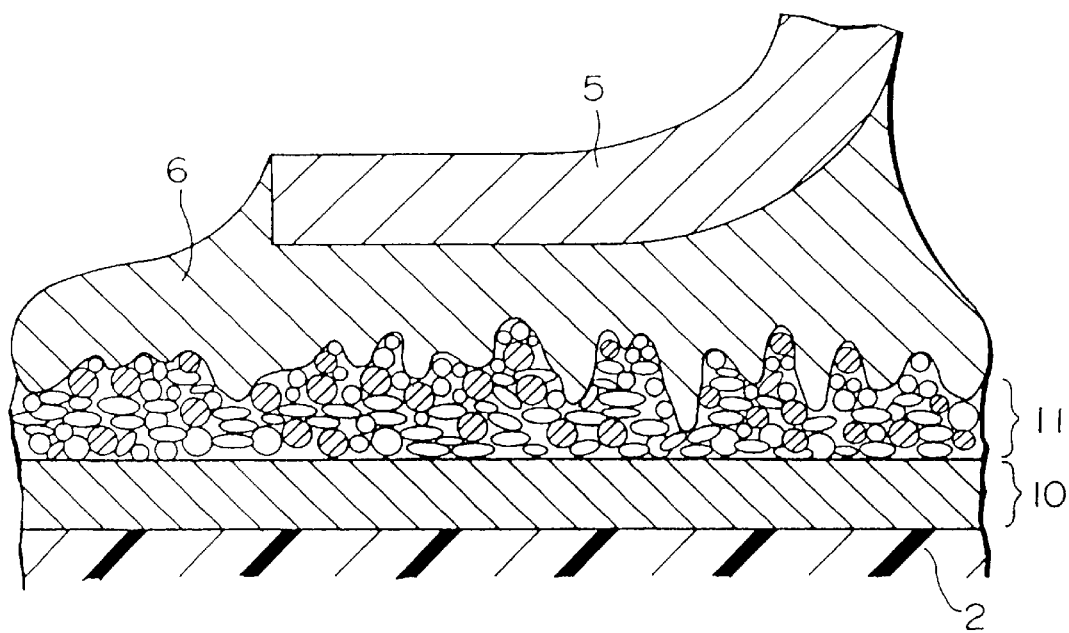
FIG. 4 is a view showing a structure in which a terminal section 5 and an electro-conductive layer 10 are soldered.

FIGS. 3 and 4 are views showing structures that an electro-conductive composition 11 layer and a solder cream 4 layer are successively stacked on an electro-conductive layer 10 on an electro-insulative substrate 2 and a terminal section 5 is attached on the solder cream 41. FIG. 3 shows the structure before heating and FIG. 4 shows the structure after the heating.

As shown in FIG. 3, a solder cream 4 layer is formed on an electro-conductive composition 11 and a terminal section 5 of an electronic component 3 is attached to the solder cream layer 4. Then the solder cream 4 layer is heated in a reflow furnace.

During the heating in the reflow furnace, as shown in FIG. 4, not only is the solder cream 4 heated and molten in the reflow furnace but the resin 15 in the electro-conductive composition 11 is molten and fluidized, so that the solder cream 4 penetrates into the electro-conductive composition 11 while the solder cream 4 forms an alloy with first metallic particles 12 which is easy to form an alloy with a solder. However, secondmetallic particles 13 hard to diffuse into a solder and an oxide 14 having a property to block penetration of a solder 6, both included in the electro-conductive composition 11 prevent the solder 6 from penetrating. For this reason, the solder 6 having formed an alloy with the first metallic particles 12 easy to form an alloy with a solder does not reach the electro-conductive layer 10 and the solder 6 having formed an alloy is fixed in the electro-conductive composition 11 while assuming a shape like a so-called anchor.

Since the solder 6 does not reach the electro-conductive layer 10 in such a manner, the resin 15 in the vicinity of the interface between the electro-conductive layer 10 and the electro-conductive composition 11 layer does not receive any influence from the solder 6. Therefore, neither is the electro-conductive composition 11 layer separated from the electro-conductive layer 10 nor the electro-conductive layer 10 is separated from the electro-insulative substrate 2.

Figure 5A:
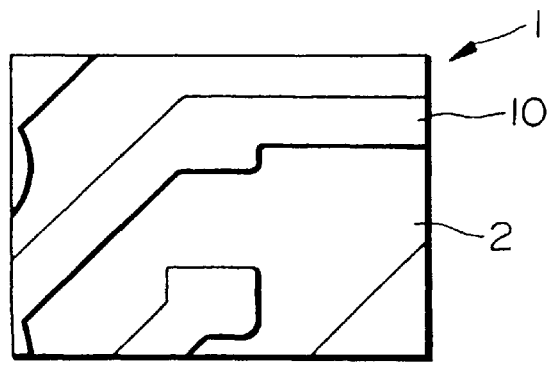
FIG. 5A is a view showing a condition in which an electro-conductive layer 10 is formed on an electro-insulative substrate 2.
Figure 5B:
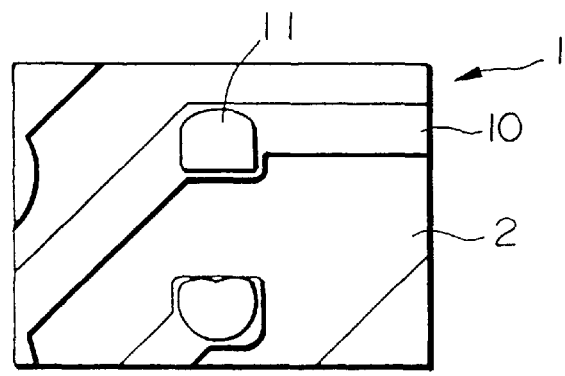
FIG. 5B is a view showing a condition in which an electro-conductive composition 11 layer is formed on the electro-conductive layer 10.
Figure 5C:
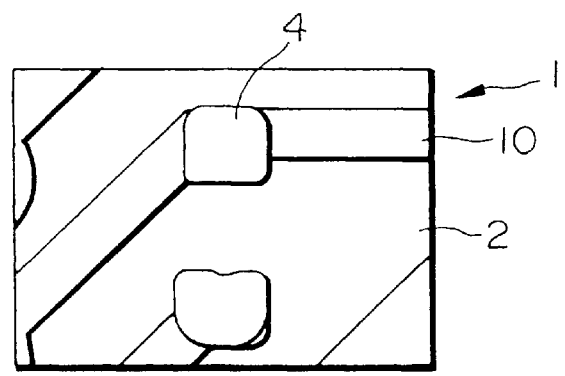
FIG. 5C is a view showing a condition in which a solder cream 4 layer is formed on the electro-conductive composition 11 layer and FIG. 5D is apartial expanded view showing a condition in which a resistor 7 is soldered.
Figure 5D:
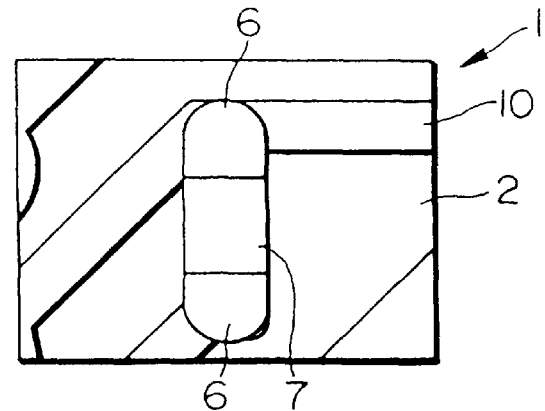

A fabrication of an electronic equipment 1 using such an electro-conductive composition is operated, for example, according to the following process steps shown in FIGS. 5A to 5D, wherein FIG. 5A is a view showing a condition in which an electro-conductive layer 10 is formed on an electro-insulative substrate 2, FIG. 5B is a view showing a condition in which an electro-conductive composition 11 layer is formed on the electro-conductive layer 10, FIG. 5C is a view showing a condition in which a solder cream 4 layer is formed on the electro-conductive composition 11 layer and FIG. 5D is apartial expanded view showing a condition in which a resistor 7 is soldered.

First of all, as shown in FIG. 5A, a paste to constitute an electro-conductive layer 10 is applied on an electro-insulative substrate 2 to form a film with a thickness of 5 to 40 μm in a predetermined pattern by a screen process printing method or the like so that the electro-conductive layer 10 is formed.

Then, as shown in FIG. 5B, an electro-conductive composition 11 is applied on a soldering place for an electronic component by a screen process printing method or the like to a thickness of 20 to 40 μm and thus an electro-conductive composition 11 layer is formed in the shape of an island.

Then, as shown in FIG. 5C, a solder cream 4 is applied on the electro-conductive composition 11 layer to form a film of 50 to 70 μm by a screen process printing method or the like and the solder cream 4 layer is thus formed.

Then, as shown in FIG. 5D, both terminal sections of a resistor 7 is attached to the solder cream 4, 4 layers and the assembly is heated in a reflow furnace to mount the resistor 7.

A similar way can be applied to other electronic components and thus an electronic equipment 1 with various electronic components mounted thereto can be fabricated.

EXAMPLES

Described below will be the present invention in examples in a detailed manner, whereas it should be understood that the present invention is not limited to description in those only.

Example 1

An electro-conductive composition of the present invention was prepared by mixing 40 wt % silver particles of an average particle diameter of 3 μm and a purity of 99.9 %, 43 wt % copper-nickel alloy particles (the weight ratio between copper and nickel is 80:20) of an average particle diameter of 10 μm, 4 wt % $Bi_2O_3$ of an average particle diameter of 5 μm, 13 wt % a resin mixture which was prepared by mixing polyester (made by Asahi Denka K. K) and phenol resin (Mitsubishi Kasei K. K.) with a mixing ratio of 85 to 15 by weight and dispersing the mixture of the components. A specific resistance of the electro-conductive composition was $8 \times 10^{-4}$ Ωcm in a dry film condition.

Next, described will be an example in which an electro-conductive composition of the present invention was applied to an electronic equipment.

Figure 6:
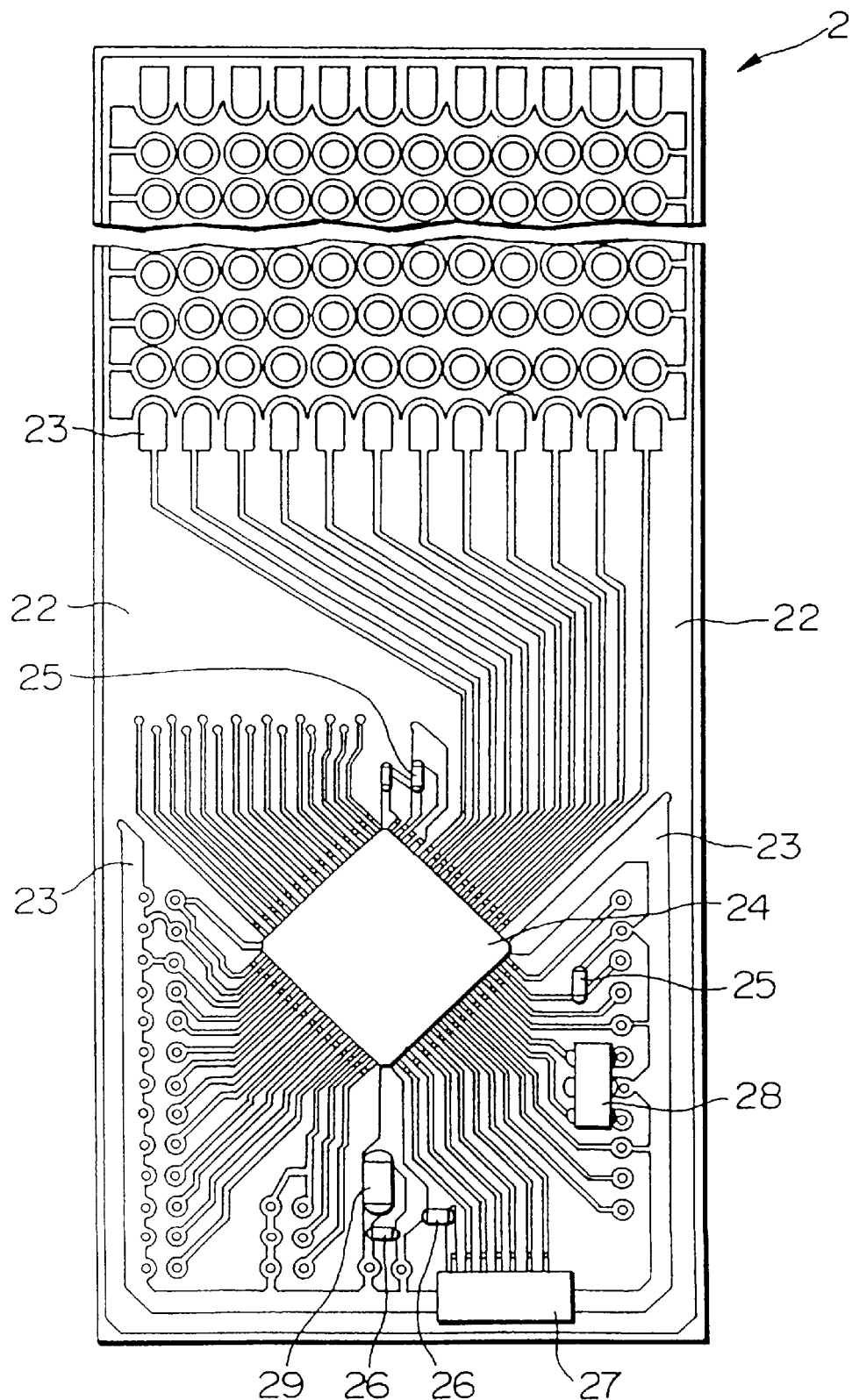
FIG. 6 is a plan view showing a pointing device circuit board 21 used for a note-book type personal computer.

A pointing device circuit board 21 for a note book type personal computer shown in FIG. 6 was fabricated by printing a circuit forming paste on a polyester film 22 to form a film and drying the film.

A paste was fabricated by mixing the electro-conductive composition obtained in Example 1 in carbitol acetate in a ratio of 4 to 1 and stirring the mixture. The paste is printed on a soldering place of the pointing device circuit board 21 to a thickness of 20 to 40 μm with use of a screen mask of 200 meshes and the printed board 21 is dried to form a land for soldering.

A low temperature solder cream (made by Senju Kinzoku K. K. No. 139) was printed to a thickness of 50 to 70 μm on the land for soldering with use of a metal mask. Terminal sections of an integrated circuit 24, a capacitor 25, a resistor 26, a connector 27, a diode array 28 and electrolytic capacitor 29 were respectively placed on the low temperature solder cream, and those components were heated in a reflow furnace at a peak temperature of 150° C. for 1 min and thereafter cooled, so that soldering was complete. In such a manner, the pointing device for the note-type personal computer was obtained.

A shearing strength in a soldering portion on the thus obtained electronic equipment was measured by a tester (made by Aiko Engineering K. K., CPU gauge 7500) and a result was 1 kg/mm².

As mentioned above, an electro-conductive composition of the present invention has mixed functions that a first metal easy to form an alloy with a solder forms an alloy with a molten solder and diffuses the solder into the electro-conductive composition and a second metal hard to diffuse into the solder and an oxide having a property to block alleviates penetration of the solder into the electro-conductive composition and therefore one kind of electro-conductive composition can perform soldering.

Accordingly, the number of steps in a soldering process is reduced, fabrication becomes easier and in addition an electronic equipment with a strong soldering portion can be obtained.

While soldering on an electro-conductive layer on a substrate on which there is not provided a metal having a good wettability, such as a plastic film, a laminated sheet, a plastic molding, a ceramic molding and the like, has been very difficult, with application of an electro-conductive composition of the present invention, the electro-conductive layer and an electronic component can be connected by soldering.

What is claimed is:

1. An electro-conductive composition comprising: 28 to 45 wt % first metallic particles easy to form an alloy with a solder; 25 to 60 wt % second metallic particles hard to diffuse into the solder; 3 to 7 wt % an oxide having a property to block penetration of the solder; and 7 to 30 wt % a resin.

2. An electro-conductive composition according to claim 1, wherein the first metallic particles easy to form an alloy with a solder are particles of at least one selected from the group consisting of silver, gold, lead and zinc, or particles of an alloy comprising of two or more selected from the group.

3. An electro-conductive composition according to claim 1, wherein the second metallic particles hard to diffuse into a solder are particles of at least one selected from the group consisting of copper, nickel, palladium and platinum, or particles of an alloy comprising two or more selected from the group.

4. An electro-conductive composition according to claim 1, wherein the oxide having a property to block penetration of a solder is any of bismuth trioxide, hafnium oxide and tantalum pentoxide.

5. An electro-conductive composition according to claim 1, where the resin is at least one selected from the group consisting of ethylene-vinyl acetate resin, vinyl chloride resin, acetyl cellulose, methacrylic resin, ethyl cellulose, butadiene resin, saturated polyester, polyamide, modified polyimide, modified epoxy resin and modified phenol resin, a modified version of at least one or a mixture comprising two or more selected from the group consisting of the above mentioned resins.

6. An electronic equipment, wherein a layer made of the electro-conductive composition according to claim 1 and a layer made of a solder are successively formed on an electro-conductive layer formed on an electro-insulative substrate and a terminal of an electronic component is connected to the electro-conductive layer.

7. An electronic equipment according to claim 6, wherein the solder is at least one solder having a melting point of 135° C. or higher selected from the group consisting of a lead-tin based solder, a lead-bismuth-tin based solder, a tin-bismuth based solder, a lead-bismuth based solder, a lead-bismuth-tin-silver based solder and a tin-bismuth-silver based solder.

* * * * *